United States Patent [19]
Maheshwari et al.

[11] Patent Number: 5,811,317
[45] Date of Patent: Sep. 22, 1998

[54] PROCESS FOR REFLOW BONDING A SEMICONDUCTOR DIE TO A SUBSTRATE AND THE PRODUCT PRODUCED BY THE PRODUCT

[75] Inventors: Abhay Maheshwari, Round Rock; Sunil Thomas, Austin; Chris Thornton, Temple, all of Tex.

[73] Assignee: Texas Instruments Incorporated, Dallas, Tex.

[21] Appl. No.: 519,561

[22] Filed: Aug. 25, 1995

[51] Int. Cl.$^6$ .......................... H01L 21/56; H01L 21/58; H01L 21/60
[52] U.S. Cl. .......................... 437/211; 437/215; 437/224
[58] Field of Search .......................... 437/211, 215, 437/224, 245, 902, 915; 257/778, 783

[56] References Cited

U.S. PATENT DOCUMENTS

| | | | |
|---|---|---|---|
| 5,037,780 | 8/1991 | Fujimoto et al. | 437/212 |
| 5,071,787 | 12/1991 | Mori et al. | 437/183 |
| 5,292,688 | 3/1994 | Hsiao et al. | 437/209 |
| 5,352,629 | 10/1994 | Paik et al. | 437/189 |

FOREIGN PATENT DOCUMENTS

| | | | |
|---|---|---|---|
| 63-293840 | 11/1988 | Japan | 437/212 |
| 64-2331 | 1/1989 | Japan | 437/212 |
| 2-44742 | 2/1990 | Japan | 437/212 |
| 2-122531 | 5/1990 | Japan | 437/212 |

*Primary Examiner*—David E. Graybill
*Attorney, Agent, or Firm*—Ronald O. Neerings; James C. Kesterson; Richard L. Donaldson

[57] ABSTRACT

A method for assembly of bare silicon die onto flexible or thin laminate substrates that minimizes substrate and die warpage induced after underfill cure operations and at the same time reduces the cycle time for the assembly process. More specifically, an opposing layer of thermoset component is adhered to a balance plate (metal) or other material with applicable coefficient of thermal expansion "CTE" and modulus of elasticity on the top of the die. The offsetting layer of material causes the die to warp to the other side and as a result the two self opposing warpage effects neutralize themselves.

18 Claims, 2 Drawing Sheets

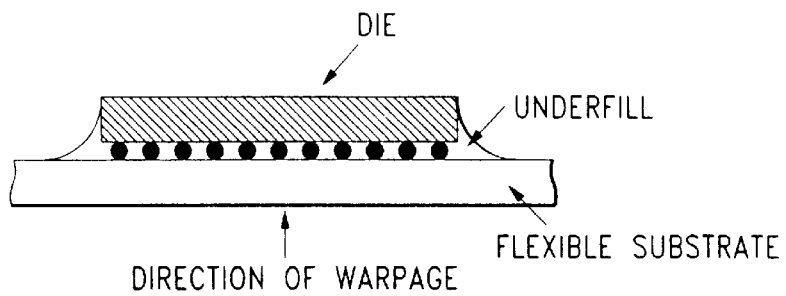
Fig. 1 PRIOR ART
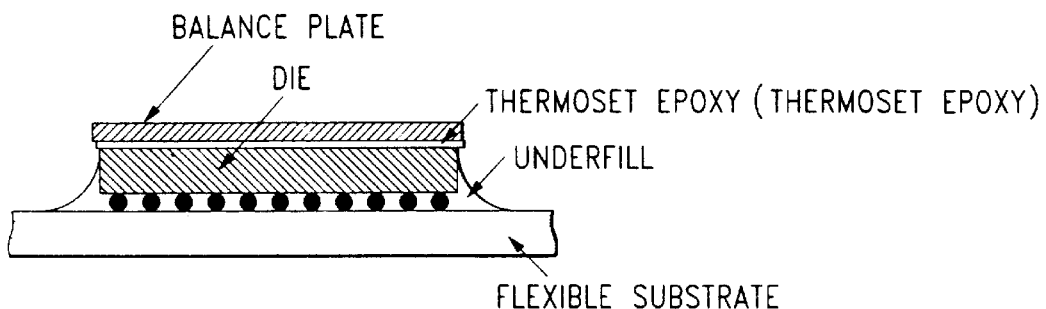
Fig. 2
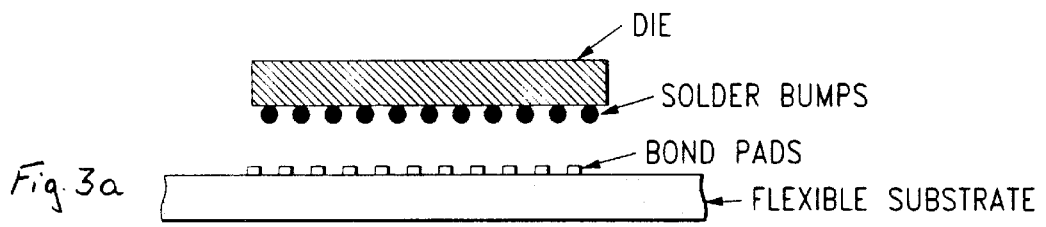
Fig. 3a
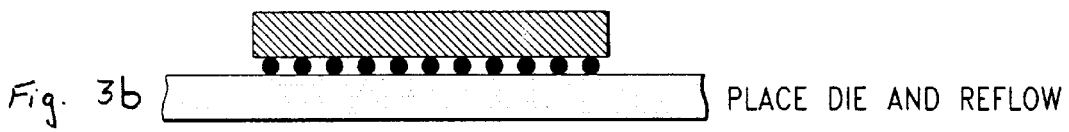
Fig. 3b
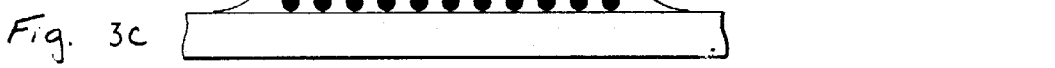
Fig. 3c
Fig. 3d
Fig. 3e

PROCESS FOR REFLOW BONDING A SEMICONDUCTOR DIE TO A SUBSTRATE AND THE PRODUCT PRODUCED BY THE PRODUCT

FIELD OF THE INVENTION

The present invention relates to a method of attaching flip chips onto flexible substrates. More specifically, the present invention relates to a method for the assembly of bare silicon dies onto flexible or thin laminate substrates that minimizes substrate and die warpage induced after underfill cure operations and prevents die cracking.

BACKGROUND OF THE INVENTION

The normal flow in a flip chip attach process is as follows: A) the die is fluxed; B) the die is placed on the substrate with bond pads on the die being aligned with bond pads on the substrate; C) solder is reflowed between bond pads on the die and substrate; D) the die is underfilled with a thermoset material; E) the underfill material is fully cured.

Underfilling ensures minimum load on the interconnects and becomes the primary load bearing member between the chip and the substrate during thermal or power cycling induced due to the operation of the chip. Thermoset type materials are commonly used in the industry as underfill material. The drawback of thermoset type epoxy is that after curing it is extremely rigid. It is very similar to the so called "bi-metallic strip" effect where two strips of differing metal attached together can warp in one direction or the other due to the CTE difference between them. The underfill CTE is typically about 20–25 PARTS PER MILLION/degree C. "PPM" whereas the die coefficient of thermal expansion (CTE) is close to 3 PPM. In this process the underfill curing operation causes the die and the substrate to warp initially. Warpage tends to be smaller when thicker organic substrates are used and greater as the rigidity and thickness of the substrate decreases.

Flip chip assembly on flexible or thin laminate substrates similarly requires underfilling in the area between the chip and the substrate to rid the solder joints of the extreme stress cycles produced during operation, as illustrated in FIG. 1. Underfilling ensures minimum loading on the interconnects and becomes the primary load bearing member between the chip and the substrate during thermal or power cycling induced due to the operation of the chip. Flexible and thin laminate substrates as well as the die itself comply to the warp of the rigid epoxy underfill material. This warpage can induce malfunction of the Si device since the device structures are very close to the Si surface. The warpage could also produce piezoelectric effects in sensitive devices. In some cases it can cause cracking of the die due to the induced strain. As the die size is increased the chances of die cracking also increases. There is no known solution to the problem of warpage of flip chips assembled on flexible or thin laminate substrates as most flip chip assembly on organic substrates have been done on thicker rigid substrates that inhibit warpage due to underfilling. Most of the dies currently assembled on flexible substrates are smaller in size and the warpage may not cause those dies to crack.

SUMMARY OF THE INVENTION

The invention disclosed herein comprises a method for the assembly of bare silicon die onto flexible or thin laminate substrates that minimizes substrate and die warpage induced after underfill cure operations and at the same time reduces the cycle time for the assembly process. More specifically, an opposing layer of thermoset component (Overfill material) is adhered to a metal sheet (copper or some other comparable material) or other material with applicable C.T.E. (an overmoulding compound which could balance the stresses in the layers) on the top of the die. This opposing layer is called a 'balance plate'. The offsetting layer of material causes the die to warp to the other side and as a result the two self opposing warpage effects neutralize themselves.

BRIEF DESCRIPTION OF THE DRAWINGS

The novel features believed characteristic of the invention are set forth in the appended claims. The invention itself, however, as well as other features and advantages thereof, will be best understood be reference to the detailed description which follows, read in conjunction with the accompanying drawings, wherein:

FIG. 1 illustrates a side view of a prior art flip chip assembly mounted on a flexible or thin laminate substrate.

FIG. 2 illustrates a side view of a flip chip assembly mounted on a flexible or thin laminate substrate, according to a preferred embodiment of the invention.

FIGS. 3A to 3E illustrate steps in a process of making the assembly of FIG. 2.

DETAILED DESCRIPTION OF PREFERRED EMBODIMENTS

Figure 4:
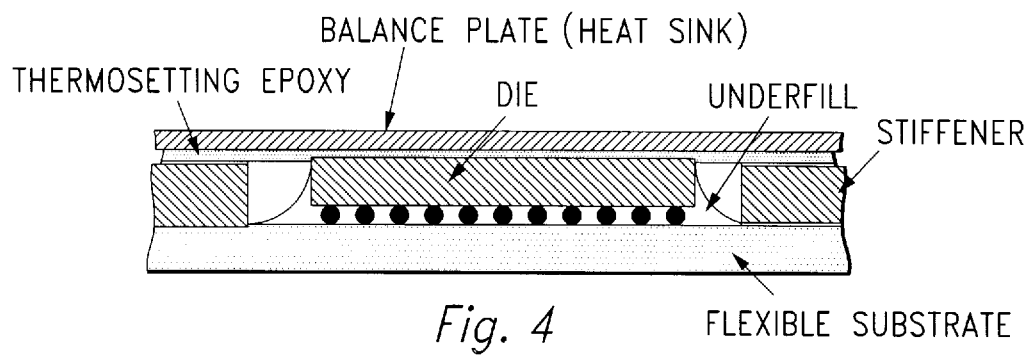
FIG. 4 illustrates a side view of a flip chip assembly including a stiffener according to a preferred embodiment of the invention.

The "bi-metallic strip" effect discussed in the background of the invention can be compensated for by applying an opposing layer of thermoset component adhered to a metal sheet or other material with applicable CTE on the top of the die, as illustrated in FIG. 2. This offsetting layer of material causes the die to warp on the other side and as a result the two self-opposing warpage effects will neutralize themselves. This thermoset epoxy can be an underfill material itself, or overmoulding compound or silver filled epoxy with comparable C.T.E. as the underfill. The balance plate should be made out of material (can be made out of Copper, Aluminum etc.) with a comparable CTE and modulus of elasticity to the flexible substrate material.

The flow in a flip chip attach process according to a preferred embodiment of the invention begins with fluxing of the die. Next, the die is placed on the substrate (presently available in ceramic, epoxy board, laminate, flex, polyimide, "UPILEX" or "KAPTON" and which sometimes includes a stiffener layer of copper, aluminum, or an alloy and preferably having a CTE close to that of the non-conductive substrate, for those substrate materials requiring reinforcement, with bond pads on the die being aligned with bond pads on the substrate. Solder is reflowed between bond pads on the die and substrate, resulting in the structure illustrated in FIG. 3, step 2. Next, the die is underfilled with a thermoset material (or other non-conductive material similar to thermoset having a good flow rate, lack of voiding and good adhesion to solder and solder masks) until the material has wicked under the die—as illustrated in FIG. 3, step 3. The underfill material is then heated to a temperature at which it gels but does not harden (the gelling temperature and time are material dependent) thus no complete curing.

Gelling time and temperature is determined by the amount of time at temperature required so that there is no warpage induced on the die and at the same time the underfill has gelled enough so that the overfill material can be dispensed, without the two of them mixing together. Since the underfill material is not completely cured, the solder joints as well as the die does not experience much stress. The heating process can be accomplished by placing the assembly in an oven, placing the assembly on a heating plate, using heat generating lights, or blowing hot air on the underfill material, and heating to the appropriate temperature.

An attach epoxy (overfill material), such as silver filled thermosetting epoxy, or thermally conductive epoxies, etc. (overfill material), is dispensed on the die surface as illustrated in FIG. 3, step 4, on or top of the balance plate itself (or an over molding material that balances out the stresses in the lamination of the structure). The metal sheet (or over molding material) is positioned on the die or on the die and stiffener material, as illustrated in FIG. 3, step 5. The entire assembly is then cured in one single step. The curing temperature depends on the underfill as well as the overfill material. This process flow eliminates the stress that would be induced on the die by two separate cure cycles (one for the underfill and one for the balance plate attach).

Figure 5:
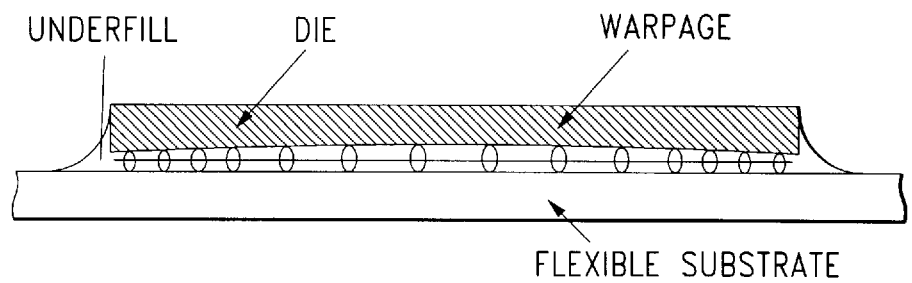
FIGS. 5 and 6 illustrate a side view of a flip chip assembly according to a preferred embodiment or the invention.
Figure 6:
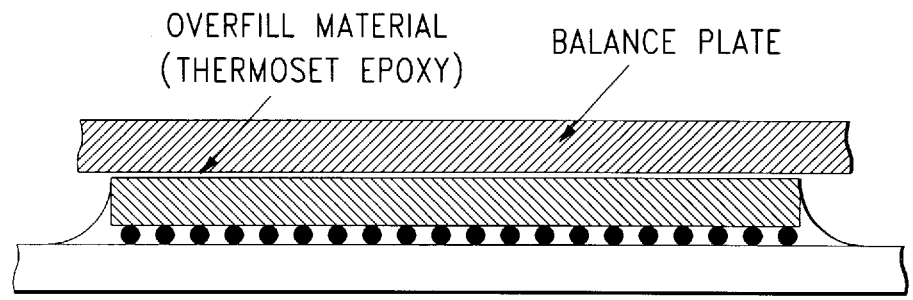

One advantage of this process is that the "dual bi-metallic strip" reduces the warpage of the silicon die and thereby reduces the induced strain. This will prevent the die from malfunction or cracking during assembly and operation. Another advantage of this process is that cycle time can be considerably decreased by doing the underfill and the balance plate attach cure operations at the same time. As a result work in process is reduced, assembly cycle time is reduced, assembly equipment requirements are reduced, and high temperature thermal excursions of the assembly are reduced. FIG. 5 shows the cross sectional photograph of an assembly without the balance plate. FIG. 6 shows the cross sectional photograph of an assembly with a balance plate configuration.

This invention also can be used for building components (packaging) using flip chip technology on flexible substrates as illustrated in FIG. 4. In these cases the balance plate can also be used as a heat sink or heat spreader.

While this invention has been described with reference to an illustrative embodiment, this description is not to be constructed in a limiting sense. Various modifications to the illustrative embodiment, as well as other embodiments of the invention will be apparent to persons skilled in the art upon reference to this description. It is therefore contemplated that the appended claims will cover any such modifications or embodiments as fall within the true scope of the invention.

What is claimed:

1. A method for the assembly of a semiconductor die onto a substrate, comprising the steps of:

placing the die onto the substrate, bond pads on the die being aligned with bond pads on the substrate;

reflowing solder between bond pads on the die and substrate;

underfilling the area between the die and the substrate with a non-electrically conductive underfilling material having adhesion to solder, and solder masks and which avoids voiding between the die and substrate;

dispensing an attach epoxy onto the die before said underfilling material cures;

placing a balance plate on top of the attach epoxy; and curing the assembly.

2. The method of claim 1, wherein said underfilling material is a thermoset material.

3. The method of claim 1, wherein controlled heat and time is used to prevent complete curing of the underfilling material.

4. The method of claim 3, wherein the underfilling material is heated to a temperature at which it gels but does not harden.

5. The method of claim 1, wherein said attach epoxy is a thermoset material.

6. The method of claim 1, wherein said attach epoxy is a thermally and/or electrically non-conductive thermosetting epoxy.

7. The method of claim 1, wherein the step of underfilling the area between the die and the substrate with a non-electrically conductive material continues until the material wicks completely under the die.

8. A method for the assembly of a semiconductor die onto a substrate, comprising the steps of:

placing the die onto the substrate, bond pads on the die being aligned with bond pads on the substrate;

reflowing solder between bond pads on the die and substrate;

underfilling the area between the die and the substrate with a non-electrically conductive underfilling material having adhesion to solder, solder masks, substrate, and the die and which avoids voiding between the die and substrate;

dispensing an attach epoxy on the die or on a balance plate before said underfilling material fully cures;

placing said balance plate on the attach epoxy or the die; and curing the entire assembly in one step.

9. The method of claim 8, wherein said underfilling material is a thermoset material.

10. The method of claim 8, wherein controlled heat and time is used to prevent full curing of the underfilling material.

11. The method of claim 10, wherein the underfilling material is heated to a temperature at which it gels but does not harden.

12. The method of claim 8, wherein said attach epoxy is a thermoset material.

13. The method of claim 8, wherein said attach epoxy is a thermally and/or electrically non-conductive thermosetting epoxy.

14. The method of claim 8, wherein said balance plate is a heat sink.

15. The method of claim 8, wherein the step of underfilling the area between the die and the substrate with a non-electrically conductive material continues until the material wicks completely under the die.

16. A product produced by the process of:

placing a semiconductor die onto a substrate, bond pads on the die being aligned with bond pads on the substrate;

reflowing solder between bond pads on the die and substrate;

underfilling the area between the die and the substrate with a non-electrically conductive material having adhesion to solder, solder masks, the substrate and the due and which avoids voiding between the die and substrate;

dispensing an attach epoxy onto one of, a) the die and b) a balance plate, before said underfilling material fully cures;

placing said balance plate on the die; and curing the entire assembly in one step.

17. A product produced by the process of claim 16, wherein said underfilling material is a thermoset material.

18. A product produced by the process of claim 17, wherein controlled heat and time is used to prevent complete curing of the underfilling material.

* * * * *